(12) United States Patent
Park et al.

(10) Patent No.: US 12,044,924 B2
(45) Date of Patent: Jul. 23, 2024

(54) LIGHT EMITING DISPLAY DEVICE AND METHOD FOR MANUFACTURING SAME

(71) Applicant: SAMSUNG ELECTRONICS CO., LTD., Suwon-si (KR)

(72) Inventors: Chunsoon Park, Suwon-si (KR); Sungyeol Kim, Suwon-si (KR); Hanmi Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/078,206

(22) Filed: Dec. 9, 2022

(65) Prior Publication Data

US 2023/0244105 A1 Aug. 3, 2023

Related U.S. Application Data

(63) Continuation of application No. PCT/KR2021/007602, filed on Jun. 17, 2021.

(30) Foreign Application Priority Data

Jun. 26, 2020 (KR) .......................... 10-2020-0078682

(51) Int. Cl.
*G02F 1/13357* (2006.01)
*G02F 1/1335* (2006.01)
(Continued)

(52) U.S. Cl.
CPC .. *G02F 1/133603* (2013.01); *G02F 1/133605* (2013.01); *G02F 1/133608* (2013.01);
(Continued)

(58) Field of Classification Search
CPC ......... G02F 1/133603; G02F 1/133605; G02F 1/133608; G02F 1/133612; H01L 25/0753; H01L 33/56; H01L 33/62
See application file for complete search history.

(56) References Cited

U.S. PATENT DOCUMENTS 7,344,902 B2 3/2008 Basin et al.
8,866,169 B2 10/2014 Emerson et al.
(Continued)

FOREIGN PATENT DOCUMENTS

JP 2015-207737 A 11/2015
JP 2019-117694 B 7/2019
(Continued)

OTHER PUBLICATIONS

Translation_written_opinion PCT (Year: 2021).*
(Continued)

*Primary Examiner* — Tracie Y Green
(74) *Attorney, Agent, or Firm* — STAAS & HALSEY LLP

(57) ABSTRACT

A display device comprising: a light source plate behind a liquid crystal panel to provide light to the liquid crystal panel. The light source plate comprises: a printed circuit board including a power wiring layer and a photo solder resist (PSR) layer; a plurality of LED chips mountable directly on the printed circuit board; and a plurality of molding parts formed of a molding material comprising a material having thixotropy to respectively surround the plurality of LED chips. A reflective sheet includes a plurality of openings formed to correspond to positions of the plurality of molding parts so that while the reflective sheet is between the liquid crystal panel and the light source plate, the plurality of molding parts are respectively positionable inside the plurality of openings with the plurality of molding members spaced apart from an inner circumferential surfaces of each of the plurality of openings.

13 Claims, 11 Drawing Sheets

(51) Int. Cl.
  *H01L 25/075* (2006.01)
  *H01L 33/48* (2010.01)
  *H01L 33/56* (2010.01)
  *H01L 33/62* (2010.01)
(52) U.S. Cl.
  CPC .... *G02F 1/133612* (2021.01); *H01L 25/0753* (2013.01); *H01L 33/486* (2013.01); *H01L 33/56* (2013.01); *H01L 33/62* (2013.01)

(56) References Cited

U.S. PATENT DOCUMENTS

| | | | |
|---|---|---|---|
| 9,048,397 | B2 | 6/2015 | Cabatbat et al. |
| 9,304,248 | B1 | 4/2016 | Moon et al. |
| 9,812,625 | B2 | 11/2017 | Miyata |
| 10,295,147 | B2 | 5/2019 | Yuan et al. |
| 2013/0328172 | A1 | 12/2013 | Tischler |
| 2016/0077274 | A1* | 3/2016 | Moon ................. G02B 6/0073 362/293 |
| 2018/0157118 | A1 | 6/2018 | Song et al. |
| 2019/0331315 | A1* | 10/2019 | Kim ................... H01L 25/0753 |
| 2022/0357620 | A1* | 11/2022 | Park ................. G02F 1/133608 |

FOREIGN PATENT DOCUMENTS

| | | |
|---|---|---|
| KR | 10-2008-0071735 A | 8/2008 |
| KR | 10-2009-0027531 A | 3/2009 |
| KR | 10-2010-0049277 A | 5/2010 |
| KR | 10-2013-0005644 A | 1/2013 |
| KR | 10-1624552 B1 | 5/2016 |
| KR | 10-1630327 B1 | 6/2016 |
| KR | 10-2017-0015580 A | 2/2017 |

OTHER PUBLICATIONS

Park, KR1020100049277, machine translation, May 2010 (Year: 2010).*
Moon, KR20130005644A, Machine Translation, 2013 (Year: 2013).*
Jeom, KR20080071735A, machine translation Aug. 2008b (Year: 2008).*
International Search Report issued in International Application No. PCT/KR2021/007602 dated Oct. 5, 2021.
International Written Opinion issued in International Application No. PCT/KR2021/007602 dated Oct. 5, 2021.

* cited by examiner

LIGHT EMITING DISPLAY DEVICE AND METHOD FOR MANUFACTURING SAME

CROSS-REFERENCE TO RELATED APPLICATION(S)

This application is a continuation application, under 35 U.S.C. § 111(a), of international application No. PCT/KR2021/007602, filed on Jun. 17, 2021, which claims priority to Korean Patent Application No. 10-2020-0078682, filed Jun. 26, 2020, in the Korean Intellectual Property Office, the disclosures of which are incorporated by reference herein in their entirety.

BACKGROUND

Field

The present disclosure relates to a display apparatus including a backlight unit.

Description of Related Art

A display apparatus is a type of output device that visually displays data information and images such as text or figures, and includes a television, various monitors, and various portable terminals (e.g., notebook computer, tablet PC and smart phone).

The display apparatus is classified into a light-emitting type using a display panel that emits light by itself, and a light-receiving type using a display panel that needs to receive light from a separate light source such as a backlight unit. As a representative example, the light-emitting panel includes an organic light-emitting diode (OLED), and the light-receiving panel includes a liquid crystal display (LCD).

The backlight unit is classified into a direct type in which the light source is disposed at the rear of the display panel and an edge type in which the light source is disposed at a lateral side of the display panel according to the location of the light source.

The direct type of the backlight unit includes a light source plate in which a Light Emitting Diode (LED) is mounted on a flat printed circuit board. The light extraction efficiency of the LED is low due to the difference in density between the air and a light emitting layer, so it is possible to increase the light efficiency by using an intermediate medium having a medium density such as silicon.

The light source plate may be manufactured with a packaging method in which a wall is formed around the LED and silicon is filled inside, or a Chip Scale Package (CSP) method in which silicon is applied in a chip array state without a wall and then diced.

However, these packaging and CSP methods are expensive to manufacture and process, and it is difficult to make the light source plate thin.

SUMMARY

One aspect of the present disclosure provides a display apparatus including a liquid crystal panel including a front surface on which an image is displayed, a light source plate to be behind the liquid crystal panel to provide a light to the liquid crystal panel, the light source plate including a printed circuit board including a power wiring layer and a Photo Solder Resist (PSR) layer, a plurality of light emitting diode (LED) chips directly mountable on the printed circuit board in a Chip On Board (COB) method, and a plurality of molding members formed of a molding material including a material having thixotropy that is dispensed to respectively surround the plurality of LED chips, and a reflective sheet including a plurality of openings formed to correspond to positions of the plurality of molding members of the light source plate so that while the reflective sheet is between the liquid crystal panel and the light source plate the plurality of molding members of the light source plate are respectively positionable inside the plurality of openings with the plurality of molding members spaced apart from an inner circumferential surface of each of the plurality of openings.

Each of the plurality of molding members may have a dome shape.

A height H of the plurality of molding members may be greater than or equal to half a radius R of an underside of the plurality of molding members.

Each of the plurality of LED chips may be a flip chip type LED including a chip body including a top surface, a side surface, and a bottom surface, and chip electrodes formed on the bottom surface of the chip body.

Each of the plurality of molding members may be formed to be in contact with at least the top surface and side surface of the chip body.

The printed circuit board may include substrate electrodes corresponding to the chip electrodes, and the chip electrodes and the substrate electrodes may be electrically connected by solder bumps.

The material having the thixotropy may include silicon dioxide ($SiO_2$).

The molding material may be a silicone or epoxy resin.

Another aspect of the present disclosure provides a display apparatus including a liquid crystal panel including a front surface on which an image is displayed, and a light source plate to be behind the liquid crystal panel to provide light to the liquid crystal panel. The light source plate includes a printed circuit board including a power wiring layer and a Photo Solder Resist (PSR) layer, a plurality of light emitting diode (LED) chips directly mountable on the printed circuit board in a Chip On Board method, a highly reflective layer to be printed on the printed circuit board to avoid contact with the plurality of LED chips, the highly reflective layer including a plurality of openings formed at a position corresponding to the plurality of LED chips, and a plurality of molding members formed of a molding material to respectively surround the plurality of LED chips so that the plurality of molding members contact with inner circumferential surfaces of the plurality of openings.

Each of the plurality of molding members may include a body positionable inside a corresponding opening of the plurality of openings and having a cylindrical shape, and a light emitter protruding from the body toward the liquid crystal panel and having a dome shape.

A height of the body may correspond to a thickness of the highly reflective layer.

The highly reflective layer may include a titanium dioxide ($TiO_2$).

Each of the plurality of LED chips may be a flip chip type LED including a chip body including a top surface, a side surface, and a bottom surface, and chip electrodes formed on the bottom surface of the chip body.

Each of the plurality of molding members may be formed to be in contact with at least the top surface and the side surface of the chip body.

The printed circuit board may include substrate electrodes corresponding to the chip electrodes, and the chip electrodes and the substrate electrodes may be electrically connected by solder bumps.

The molding material may include silicone.

Another aspect of the present disclosure provides a manufacturing method for a display apparatus including preparing a printed circuit board including a power wiring layer and a Photo Solder Resist (PSR) layer, mounting a plurality of light emitting diode (LED) chips on the printed circuit board in a Chip On Board (COB) method, printing a highly reflective layer on the printed circuit board to avoid the plurality of LED chips and forming a plurality of molding members surrounding the plurality of LED chips, respectively, by dispensing a molding material to each of the plurality of the LED chips.

The highly reflective layer may include a plurality of openings formed at positions corresponding to the plurality of LED chips.

Each of the plurality of molding members may be formed in contact with an inner circumferential surface of the corresponding opening.

Each of the plurality of molding members may include a body disposed inside a corresponding opening of the plurality of openings and having a cylindrical shape, and a light emitter protruding from the body toward the liquid crystal panel and having a dome shape. A height of the body may correspond to a thickness of the highly reflective layer.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
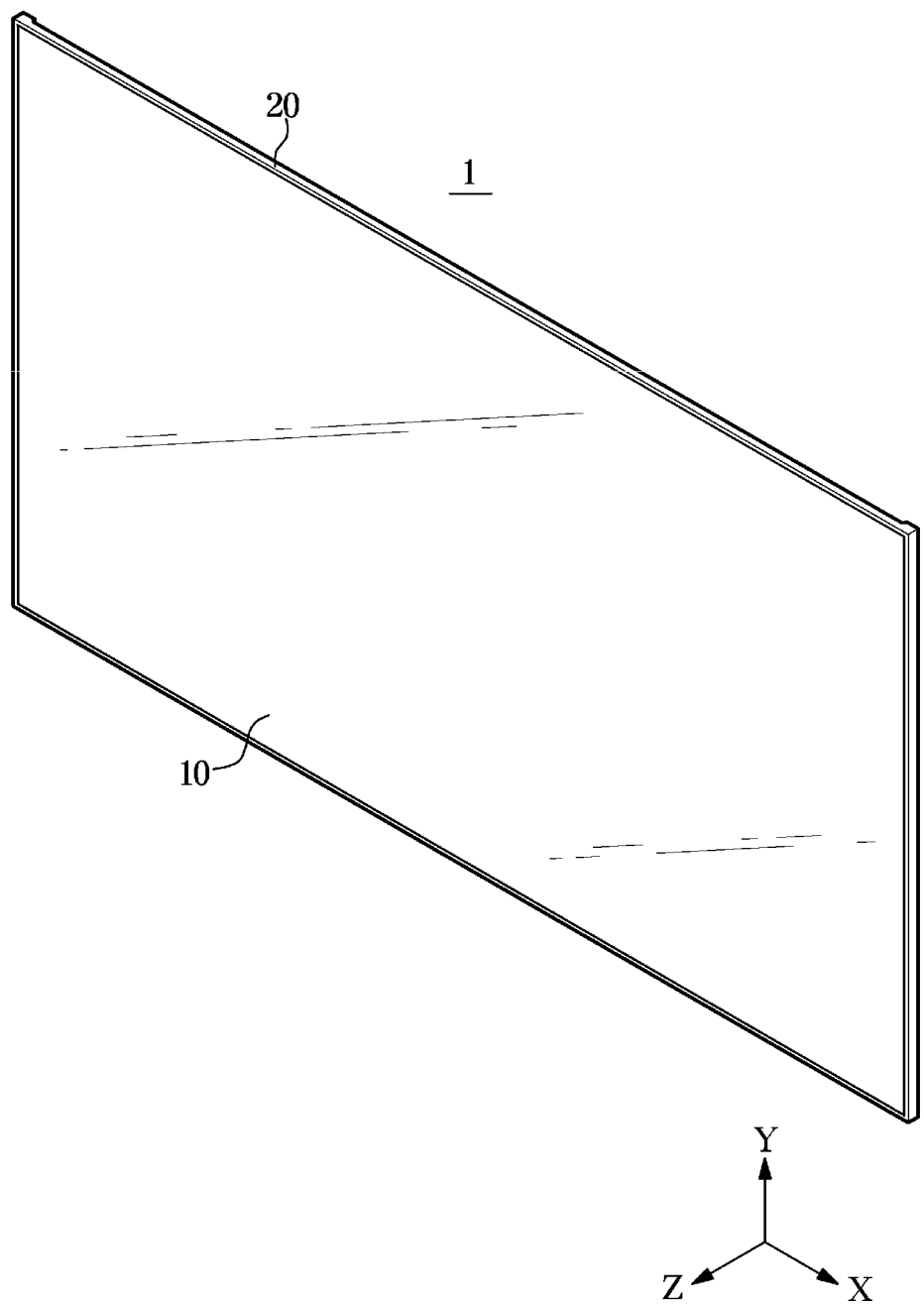
FIG. 1 is a view illustrating an appearance of a display apparatus according to one embodiment of the present disclosure.

Embodiments described in the present disclosure and configurations shown in the drawings are merely examples of the embodiments of the present disclosure, and may be modified in various different ways at the time of filing of the present application to replace the embodiments and drawings of the present disclosure.

A singular expression used in the description may include a plural expression unless the context clearly indicates otherwise. The shapes and sizes of elements in the drawings may be exaggerated for clear explanation.

In this specification, terms such as 'include' or 'have' are intended to refer to the presence of features, numbers, steps, operations, components, parts, or combinations thereof described in the specification. Therefore, it should be understood that the possibility of addition or existence of one or more other features, numbers, steps, operations, components, parts, or combinations thereof is not precluded in advance.

The directions of "front", "rear", "upper", "lower", "left" and "right" are uniformly referred to throughout the description based on the directions shown in FIG. 1 of the accompanying drawings. In FIG. 1, X-axis, Y-axis, and Z-axis directions perpendicular to each other are indicated, the X-axis direction means a long side 11 direction of a liquid crystal panel 10, and the Y-axis direction means a short side 12 of the liquid crystal panel 10, and the Z-axis direction means a front-rear direction.

The present disclosure is directed to providing a display apparatus including a light source plate capable of increasing light efficiency and preventing a luminance unevenness (Mura) and a method for manufacturing the same.

The present disclosure is directed to providing a display apparatus including a light source plate capable of reducing a cost and reducing a thickness of the display apparatus and a method for manufacturing the same.

A shape of molding members formed to surround a light emitting diode (LED) chip of a light source plate may be maintained uniformly, and thus the occurrence of luminance unevenness (Mura) may be suppressed, and a beam angle of the LED chip may be widened.

Further, because a light source plate is formed by directly mounting a bare LED chip on a printed circuit board, a cost may be reduced, and a thickness may be reduced.

Hereinafter embodiments according to the present disclosure will be described in detail with reference to the accompanying drawings.

Figure 2:
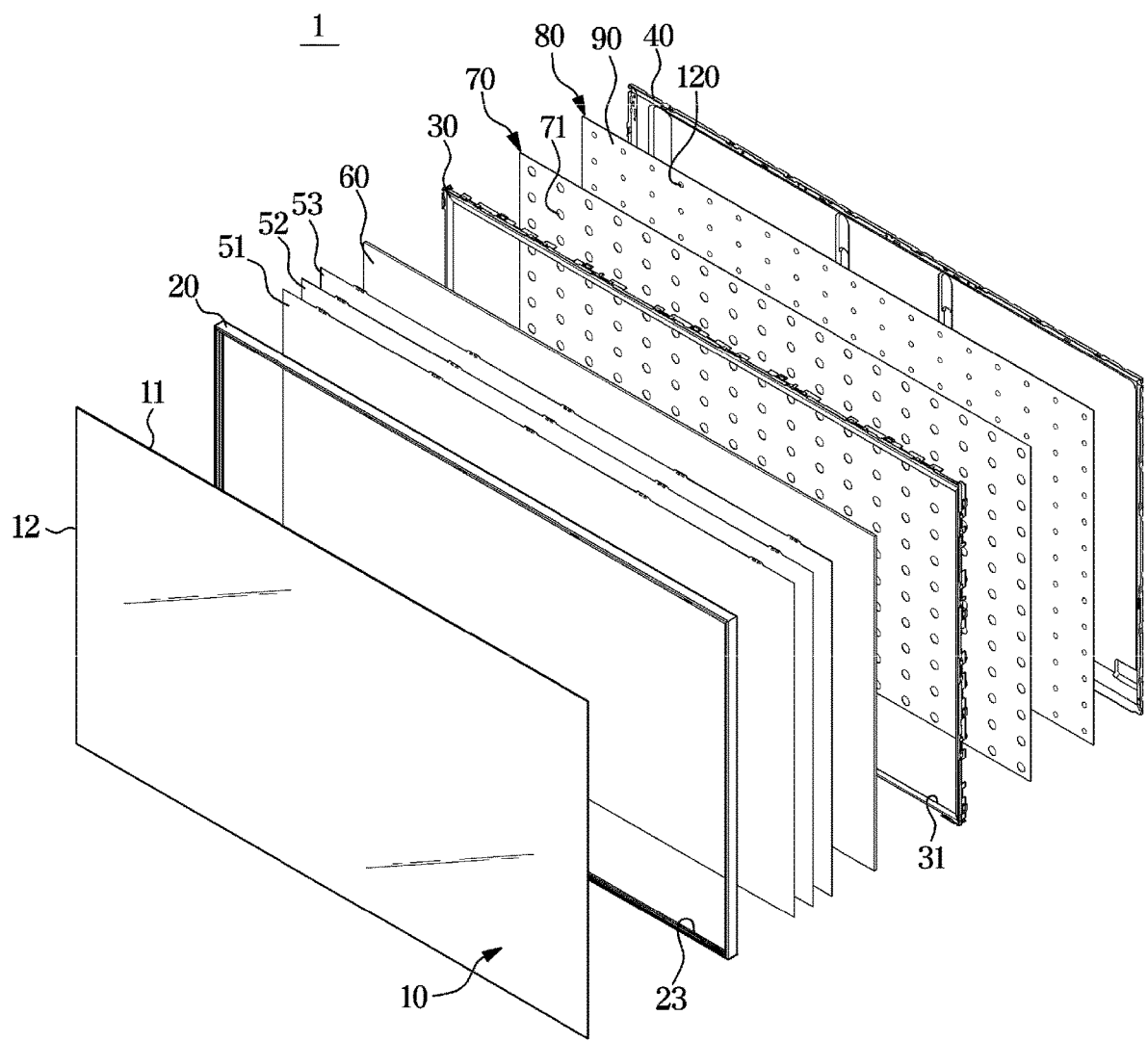
FIG. 2 is an exploded view illustrating the display apparatus according to one embodiment of the present disclosure.
Figure 3:
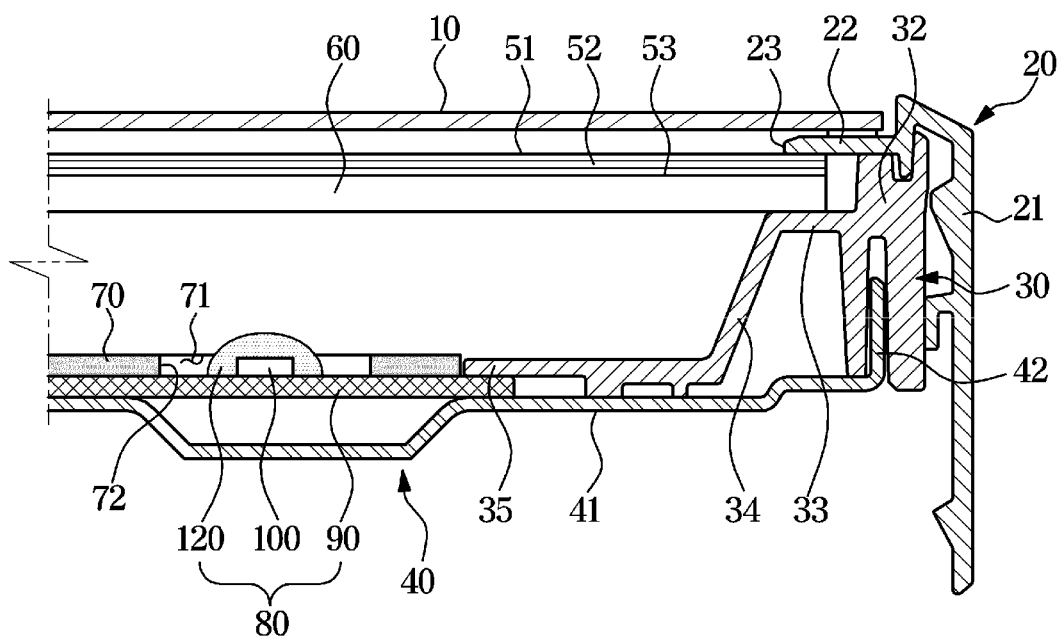
FIG. 3 is a cross-sectional view illustrating the display apparatus according to one embodiment of the present disclosure.

FIG. 1 is a view illustrating an appearance of a display apparatus according to one embodiment of the present disclosure. FIG. 2 is an exploded view illustrating the display apparatus according to one embodiment of the present disclosure. FIG. 3 is a cross-sectional view illustrating the display apparatus according to one embodiment of the present disclosure.

Referring FIGS. 1 to 3, a display apparatus 1 may include the liquid crystal panel 10 displaying an image, a backlight unit disposed behind the liquid crystal panel 10 to provide light to the liquid crystal panel 10, and a chassis assembly supporting the backlight unit and the liquid crystal panel 10.

The chassis assembly may include a rear chassis 40 provided to support the backlight unit, a front chassis 20 provided in front of the rear chassis 40 to support the liquid crystal panel 10, and a middle mold 30 coupled between the front chassis 20 and the rear chassis 40.

The liquid crystal panel 10 may include a thin film transistor substrate on which thin film transistors are formed in the form of a matrix, a color filter substrate coupled to the thin film transistor substrate side by side, and liquid crystal injected between the thin film transistor substrate and the color filter substrate. The liquid crystal may have different optical properties according to changes in voltage or temperature.

The backlight unit may be disposed at the rear of the liquid crystal panel 10 to illuminate the liquid crystal panel 10. The backlight unit may include a light source plate 80 including a printed circuit board 90 on which light emitting diode (LED) chips 100 are mounted, which is light sources, and an optical member disposed on a movement path of light emitted from the light source plate 80.

The light source plate 80 may have a flat shape and be disposed parallel to the liquid crystal panel 10.

The light source plate 80 may include the printed circuit board 90 and the plurality of LED chips 100 mounted on a surface of the printed circuit board 90 facing the liquid crystal panel 10, and a plurality of molding members 120 formed to surround each of the plurality of LED chips 100 to protect the plurality of LED chips 100 and to increase light efficiency. A specific structure of the light source plate 80 will be described later.

The optical members may be disposed on the movement path of the light emitted from the LED chips 100 to guide a traveling direction of light, reflect the light, diffuse the light, or improve optical characteristics.

The optical members may include a reflective sheet 70 reflecting light to prevent light loss, a diffuser plate 60 evenly diffusing the irregular light emitted from the light source plate 80, a quantum dot sheet 53 improving color reproducibility by changing a wavelength of light, and optical sheets 51 and 52 improving optical characteristics.

The reflective sheet 70 may reflect the light emitted from the light source plate 80 or the light emitted from the diffuser plate 60 to the diffuser plate 60. The reflective sheet 70 may be disposed on the light source plate 80 to be in close contact with the light source plate 80.

The reflective sheet 70 may include a plurality of openings 71 formed to correspond to the plurality of molding members 120. The plurality of molding members 120 may be disposed inside the corresponding opening 71. Each of the plurality of molding members 120 may be spaced apart from an inner circumferential surface 72 of the corresponding opening 71. Due to this arrangement structure, the light emitted from the LED chips 100 may be prevented from being blocked by the inner circumferential surface 72 of the opening 71 and a beam angle thereof may be increased.

The diffuser plate 60 may evenly diffuse the light emitted from the light source plate 80 and support the quantum dot sheet 53 and the optical sheets 51 and 52. The diffuser plate 60 may evenly diffuse the light incident on an incident surface and emit the light to an emission surface.

The quantum dot sheet 53 may be disposed in front of the diffuser plate 60 to be spaced apart from the diffuser plate 60. Quantum dots, which are semiconductor crystals having a size of several nanometers, may be dispersedly disposed inside the quantum dot sheet 53. The quantum dots may receive blue light and generate all colors of visible light according to its size. The smaller the size of the quantum dot, the shorter the wavelength of light may be generated, and the larger the size of the quantum dot, the longer the light may be generated.

The optical sheets 51 and 52 may be disposed in front of the diffuser plate 60 to improve optical characteristics of the light emitted from the diffuser plate 60. The optical sheets 51 and 52 may include a diffuser sheet canceling the pattern of the diffuser plate 60 and a prism sheet improving luminance by concentrating light. In addition, the optical sheets 51 and 52 may include a protective sheet protecting the other optical sheet from external impact or an introduction of foreign matter, and a reflective polarization sheet (Dual Brightness Enhancement Film: DBEF) improving luminance by transmitting one polarized light and reflecting the other polarized light.

The rear chassis 40 may be disposed at the rear of the backlight unit. The rear chassis 40 may have a shape in which a rim is bent forward. The backlight unit may be accommodated between the rear chassis 40 and the front chassis 20.

The rear chassis 40 may include a rear base 41 on which the light source plate 80 is installed, and a rear side surface 42 formed on upper, lower, left, and right edges of the rear chassis 40 so as to be coupled to the middle mold 30.

The rear chassis 40 may function to radiate the heat generated from a heating element such as the LED chip 100 to an outside. For this, the rear chassis 40 may be formed of a metal material such as aluminum or SUS, or a plastic material such as ABS.

The front chassis 20 may have a frame shape including an opening 23 to allow the light of the backlight unit to be provided to the liquid crystal panel 10. The front chassis 20 may include a front side 21 formed at upper, lower, left, and right edges of the front chassis 20 so as to be coupled to the middle mold 30, and a panel support 22 protruding inwardly from the front side 21 so as to support the liquid crystal panel 10.

The middle mold 30 may support the diffuser plate 60 and reflect the light emitted from the LED chip 100 to the diffuser plate 60. The middle mold 30 may maintain a gap between the diffuser plate 60 and the LED chip 100. The middle mold 30 may be coupled between the front chassis 20 and the rear chassis 40.

The middle mold 30 may be formed in a frame shape including an opening 31. The middle mold 30 may include a frame 32 to which the front chassis 20 and the rear chassis 40 are coupled, a diffuser plate support 33 protruding inwardly from the frame 32 to support the diffuser plate 60, a reflector 34 extending from the diffuser plate support 33 to reflect the light, and a substrate support 35 extending from the reflector 34 to support the printed circuit board 90.

The frame 32 may be formed at the upper, lower, left, and right edges of the middle mold 30. The frame 32 may be coupled to the front chassis 20 and the rear chassis 40 using various known fitting structures and separate fastening members.

The diffuser plate support 33 may protrude inwardly from the frame 32 to support the diffuser plate 60. The diffuser plate support 33 may support an edge of an incident surface of the diffuser plate 60. The diffuser plate support 33 may be formed parallel to the base 41 of the rear chassis 40.

The reflector 34 may reflect the light emitted from the light source plate 80 to the incident surface of the diffuser plate 60. The reflector 34 may extend substantially in an inwardly inclined manner from the diffuser plate support 33.

The substrate support 35 may fix the printed circuit board 90 of the light source plate 80 to prevent the printed circuit board 90 from being lifted from the base 41 of the rear chassis 40. The substrate support 35 may be formed at an inner end of the reflector 34. An edge of the printed circuit board 90 of the light source plate 80 may be supported by the substrate support 35 and the base 41.

The frame 32, the diffuser plate support 33, the reflector 34, and the substrate support 35 of the middle mold 30 may be integrally formed. A highly reflective material may be coated on a surface of the middle mold 30. The highly reflective material may be coated on the entire surface of the middle mold 30 or only on the surface of the reflector 34. The entire middle mold 30 or the reflector 34 of the middle mold 30 may have a white color to allow light to be reflected well.

Figure 4:
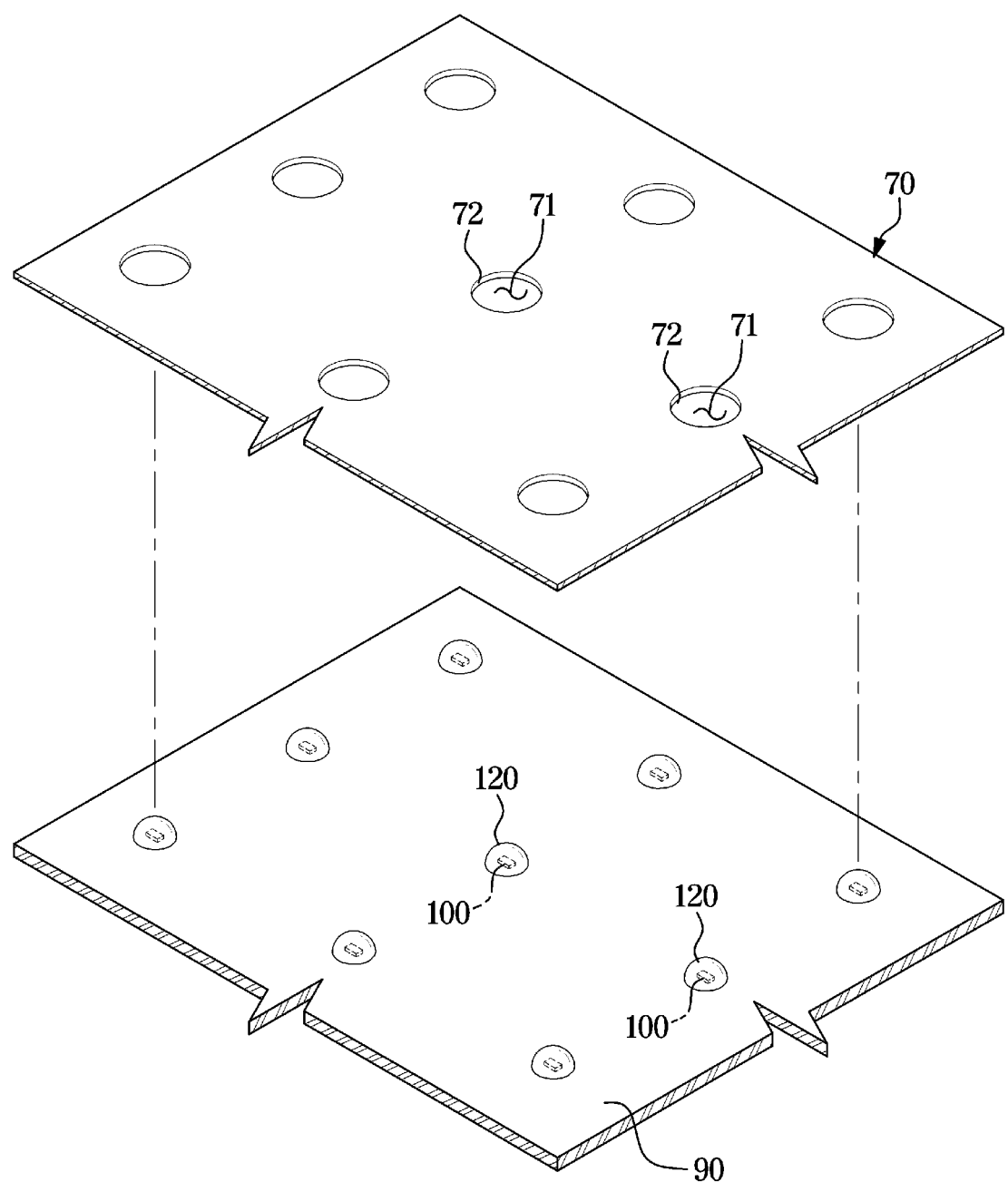
FIG. 4 is a perspective view illustrating a light source plate and a reflective sheet of the display apparatus according to one embodiment of the present disclosure.
Figure 5:
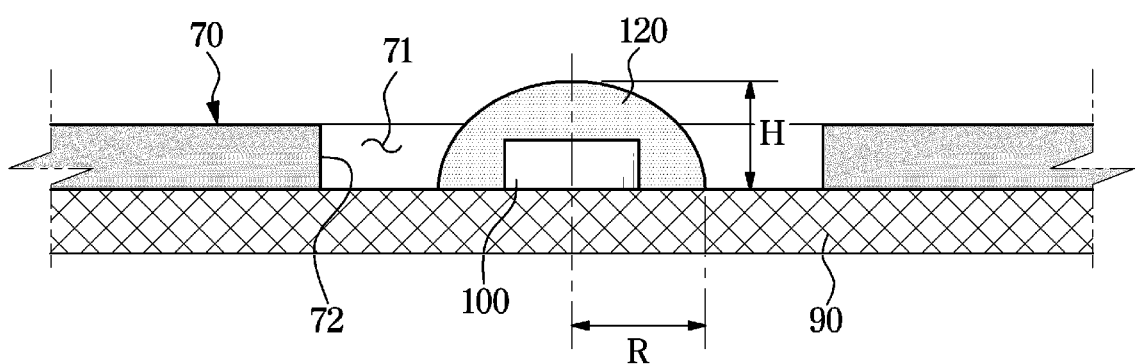
FIG. 5 is a cross-sectional view illustrating the light source plate and the reflective sheet of the display apparatus according to one embodiment of the present disclosure.
Figure 6:
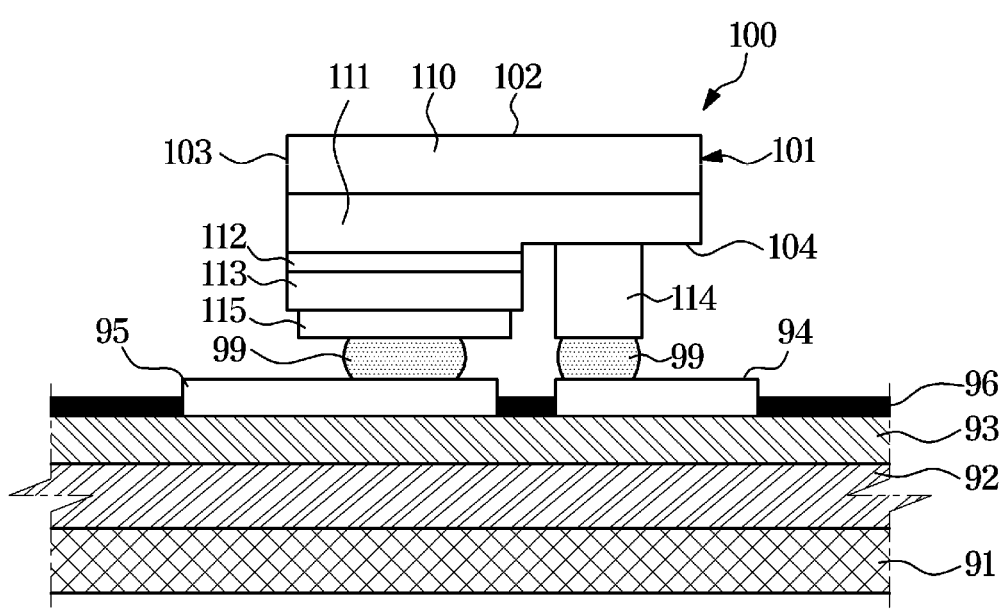
FIG. 6 is a cross-sectional view illustrating a structure in which a light emitting diode (LED) chip of the display apparatus according to one embodiment of the present disclosure is mounted on a printed circuit board.

FIG. 4 is a perspective view illustrating a light source plate and a reflective sheet of the display apparatus according to one embodiment of the present disclosure. FIG. 5 is a cross-sectional view illustrating the light source plate and the reflective sheet of the display apparatus according to one embodiment of the present disclosure. FIG. 6 is a cross-sectional view illustrating a structure in which the LED chip of the display apparatus according to one embodiment of the present disclosure is mounted on a printed circuit board.

A structure and manufacturing method of the light source plate according to one embodiment of the present disclosure will be described in detail with reference to FIGS. 4 to 6.

The printed circuit board 90 of the light source plate 80 may include a base 91, a power wiring layer 93 including a metal wiring (not shown), and an insulation layer 92 formed between the base 91 and the power wiring layer 93. In addition, the printed circuit board 90 may include a photo solder resist (PSR) layer 96 formed on the power wiring layer 93 to protect a pattern of the power wiring layer 93 and to increase light efficiency.

The base 91 may serve to form a skeleton of the light source plate 80, and any substrate capable of applying a voltage to the LED chip 100 through the power wiring layer 93 may be used. For example, the base 91 may be formed of a material such as FR-4, ceramic, polyimide, PET, or glass.

The metal wiring of the power wiring layer 93 may be formed by patterning a conductive material on the base 91.

The insulating layer 92 may be positioned between the base 91 and the power wiring layer 93 to electrically insulate the base 91 and the metal wiring of the power wiring layer 93.

The PSR layer 96 may be formed by applying a photo solder resist (PSR) ink on the power wiring layer 93.

The plurality of LED chips 100 may be mounted on the printed circuit board 90. The plurality of LED chips 100 may be mounted at a predetermined interval. The plurality of LED chips 100 may be mounted in a matrix form on the printed circuit board 90.

The LED chip 100 may be directly mounted on the printed circuit board 90 in a Chip On Board (COB) method. The LED chip 100 may be an inorganic light emitting element. The inorganic light emitting element may be manufactured by growing an inorganic material as a thin film on a sapphire, gallium arsenide (GaAs), or silicon (Si)-based base substrate. The inorganic materials may be aluminum (AL), gallium (Ga), nitrogen (N), phosphorus (P), arsenic (As), or indium (In).

The LED chip 100 may be picked up from a base substrate and directly transferred to the printed circuit board 90. The LED chip 100 may be picked up and transported using an electrostatic method using an electrostatic head or an adhesive method using an elastic polymer material such as PDMS or silicon as a head.

The LED chip 100 may be a flip chip type LED including a chip body 101 including a top surface 102, at least one side surface 103, and a bottom surface 104, and chip electrodes 114 and 115 formed on the bottom surface 104 of the chip body 101. The LED chip 100 may have a substantially hexahedral shape, and the at least one side surface 103 may include four side surfaces.

This flip-chip type LED may be directly mounted on the printed circuit board 90 through the chip electrodes 114 and 115 formed on the bottom surface 104 without a separate connection structure such as a metal lead or a wire. Therefore, the flip chip type LED may have high efficiency in a manufacturing process and the miniaturization and light weighting of the LED chip 100 may be implemented. In addition, because the chip electrodes 114 and 115 are positioned in a direction opposite to a light emission direction of the LED chip 100, the light emission efficiency of the LED chip 100 may be improved.

However, unlike the present embodiment, the LED chip 100 may be a lateral type or a vertical type. In the lateral type, the chip electrodes are horizontally arranged, and two wires are required, and in the vertical type, the chip electrodes are vertically overlapped with each other, and one wire is required.

The LED chip 100 may include a growth substrate 110, an n-type semiconductor layer 111, an active layer 112, a p-type semiconductor layer 113, an n-type chip electrode 114, and a p-type chip electrode 115.

The growth substrate 110 may be a sapphire substrate suitable for a nitride semiconductor growth substrate, but not be limited thereto. The substrate used for semiconductor single crystal growth, such as a silicon substrate or a GaN substrate, may also be used as the growth substrate 110.

The N-type semiconductor layer 111, the active layer 112, and the p-type semiconductor layer 113 may be formed of a nitride semiconductor. The active layer 112 may function as a light emitting layer that emits the light corresponding to the band gap energy by recombination of electrons and holes.

The N-type chip electrode 114 and the P-type chip electrode 115 may be formed using a material capable of making ohmic contact with the nitride semiconductor. For example, a metal material such as silver (Ag) or aluminum (Al) may be used.

The printed circuit board 90 may include an n-type substrate electrode 94 corresponding to the n-type chip electrode 114 and a p-type substrate electrode 95 corresponding to the p-type chip electrode 115. The n-type chip electrode 114 and the p-type chip electrode 115 may be electrically connected to the n-type substrate electrode 94 and the p-type substrate electrode 95 by solder bumps 99 having conductivity.

However, unlike the embodiment, the n-type chip electrode 114 and the p-type chip electrode 115 may be electrically connected to the n-type substrate electrode 94 and the p-type substrate electrode 95 by an anisotropic conductive film. The anisotropic conductive film is a film having a structure in which conductive balls are dispersed in an adhesive resin. When pressure is applied to the conductive ball, the thin insulating film surrounding the conductive ball is broken, and the conductive ball may electrically connect the electrodes.

The plurality of molding members 120 may be formed to surround the plurality of LED chips 100 to protect the plurality of LED chips 100 and to increase light efficiency.

The plurality of molding members 120 may be formed by dispensing a liquid molding material to the plurality of LED chips 100 and then curing the liquid molding material. The molding material may be silicone or epoxy resin. When the molding material is dispensed to the LED chip 100, the molding material may be spread by gravity to surround the LED chip 100. Accordingly, the molding member 120 may have a substantially dome shape, and may be formed to be in contact with at least the top surface 102 and the side surface 103 of the LED chip 100.

When the molding material is spread to surround the LED chip 100, the shape of the molding member 120 may have a deviation depending on a degree of spreading. When the deviation occurs, the uniformity of the optical characteristics of the light source plate 80 is deteriorated, and thus luminance unevenness (Mura) may be found on the display apparatus.

Therefore, in order to minimize the shape deviation between the molding member 120, the molding material may include a material having thixotropy. As for a thixotropic material, it is possible to reduce a flowability of the material by increasing the thixotropy. Accordingly, when the molding material is dispensed, the degree of spreading is reduced, and the shape deviation between the plurality of molding members 120 may be reduced. Various materials may be used as the material having such thixotropic properties, and for example, silicon dioxide (SiO2) may be used.

The molding material may have an appropriate thixotropic index to allow a height H of the molding member 120 to be greater than or equal to half a radius R of an underside of the molding member 120. Due to the molding member 120 having the appropriate thixotropic index, the light source plate 80 may obtain high light efficiency and beam angle. In addition, the shape deviation between the molding members 120 may be minimized to prevent the luminance unevenness (Mura) from being recognized.

Figure 7:
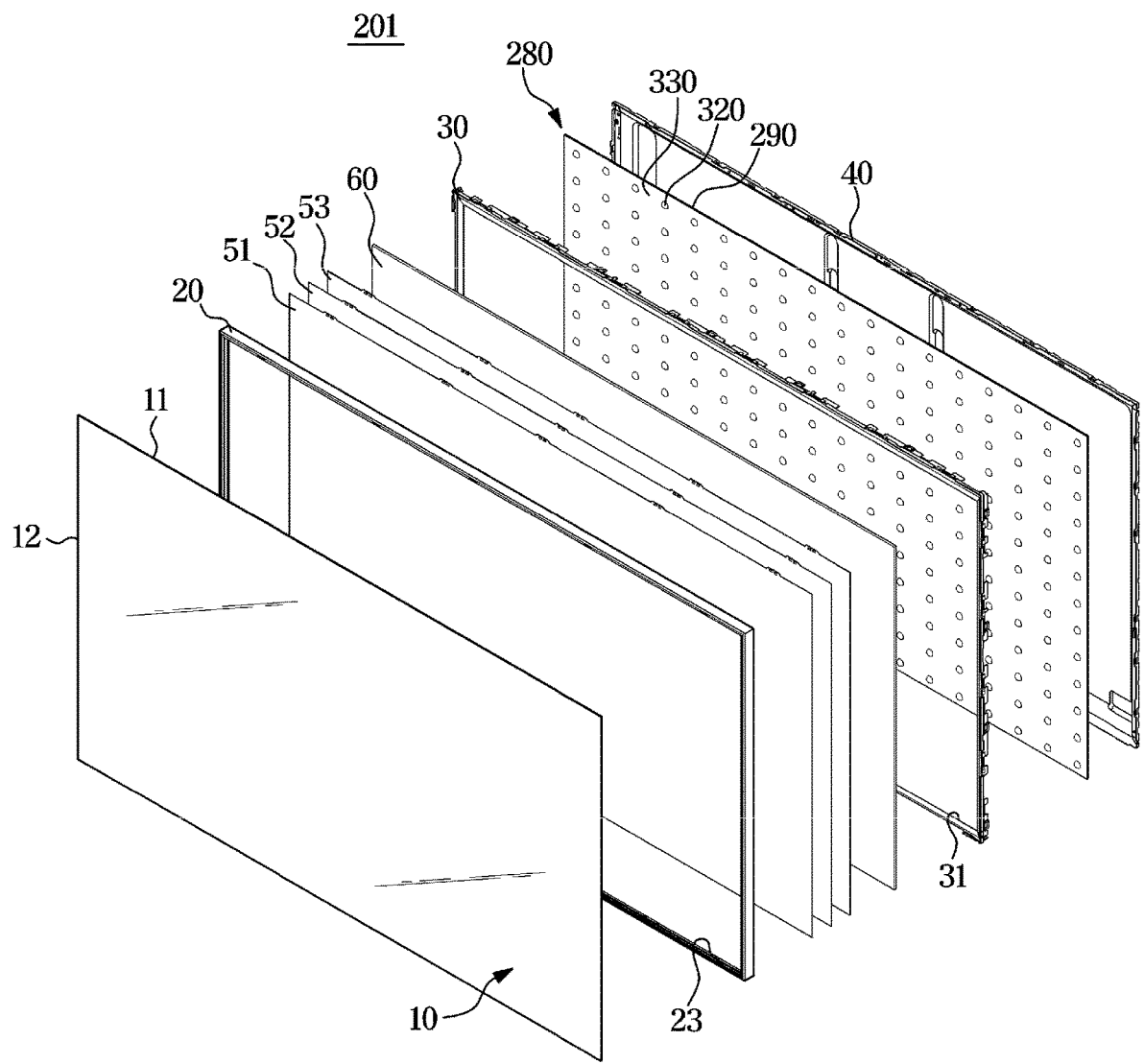
FIG. 7 is an exploded view illustrating a display apparatus according to another embodiment of the present disclosure.
Figure 8:
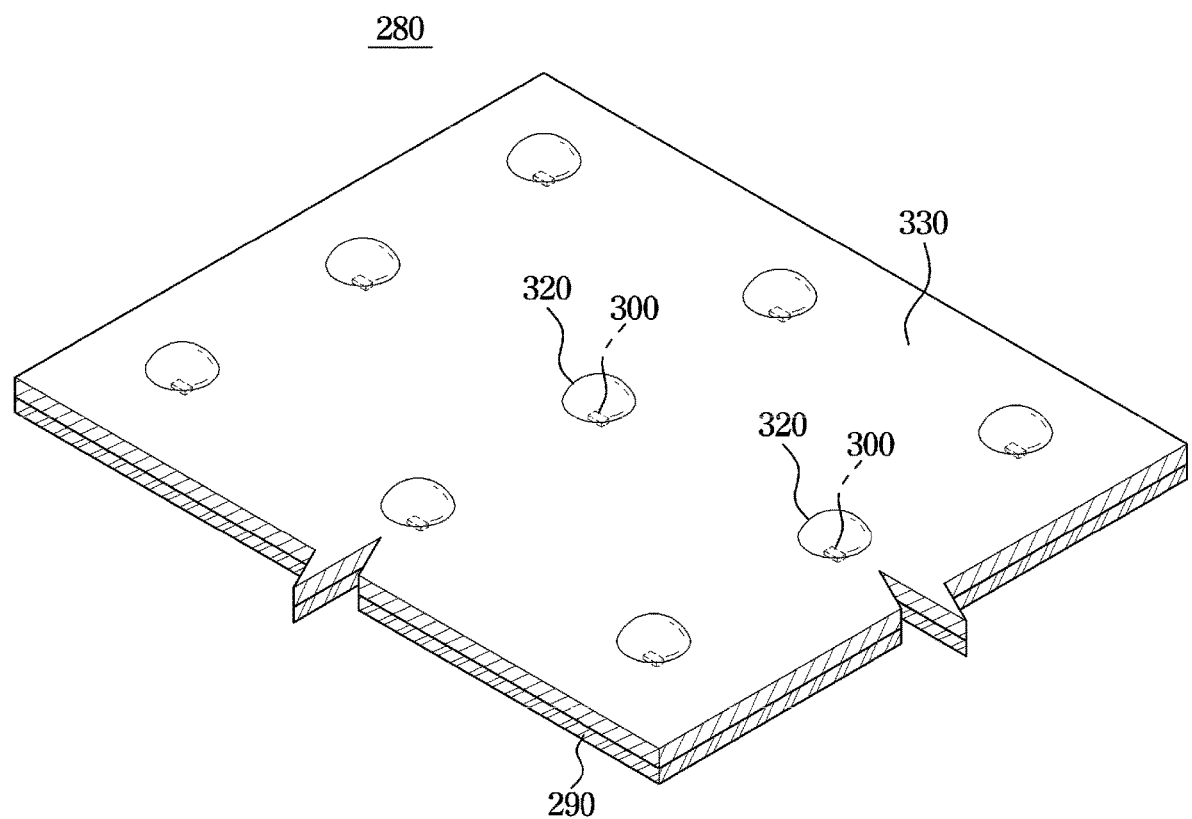
FIG. 8 is a view illustrating a light source plate of the display apparatus according to another embodiment of the present disclosure.
Figure 9:
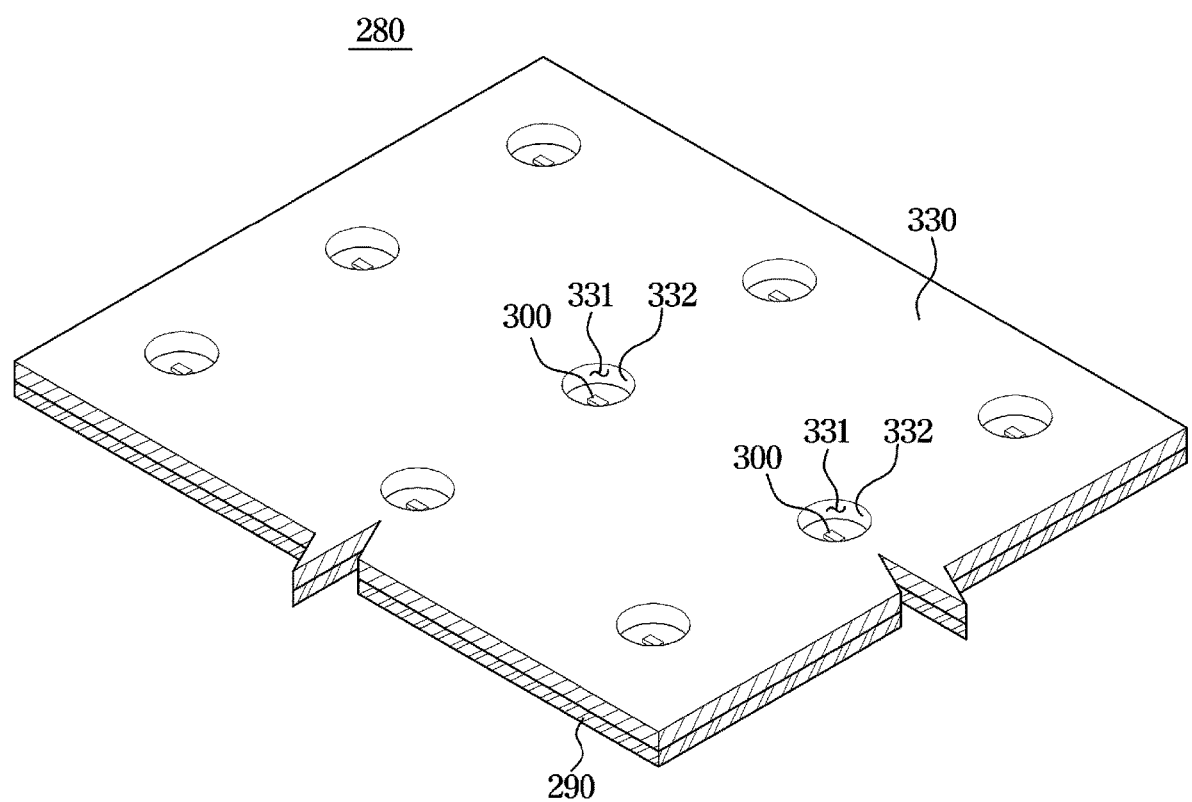
FIG. 9 is a view illustrating the light source plate of the display apparatus according to another embodiment of the present disclosure, particularly, a state before dispensing a molding material on the LED chips.
Figure 10:
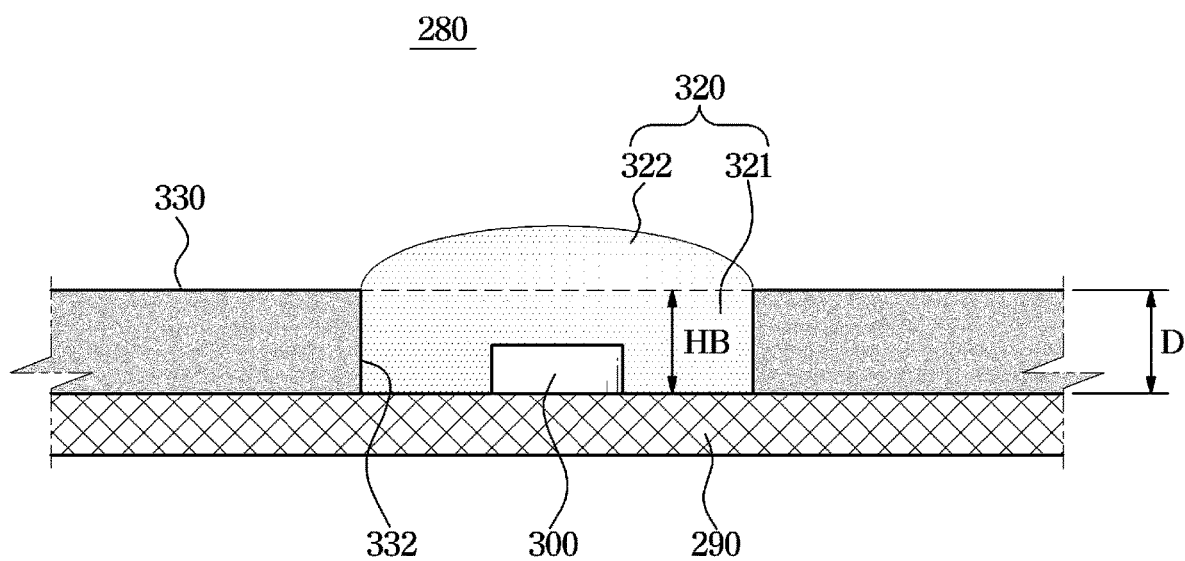
FIG. 10 is a cross-sectional view of the light source plate of the display apparatus according to another embodiment of the present disclosure.
Figure 11:
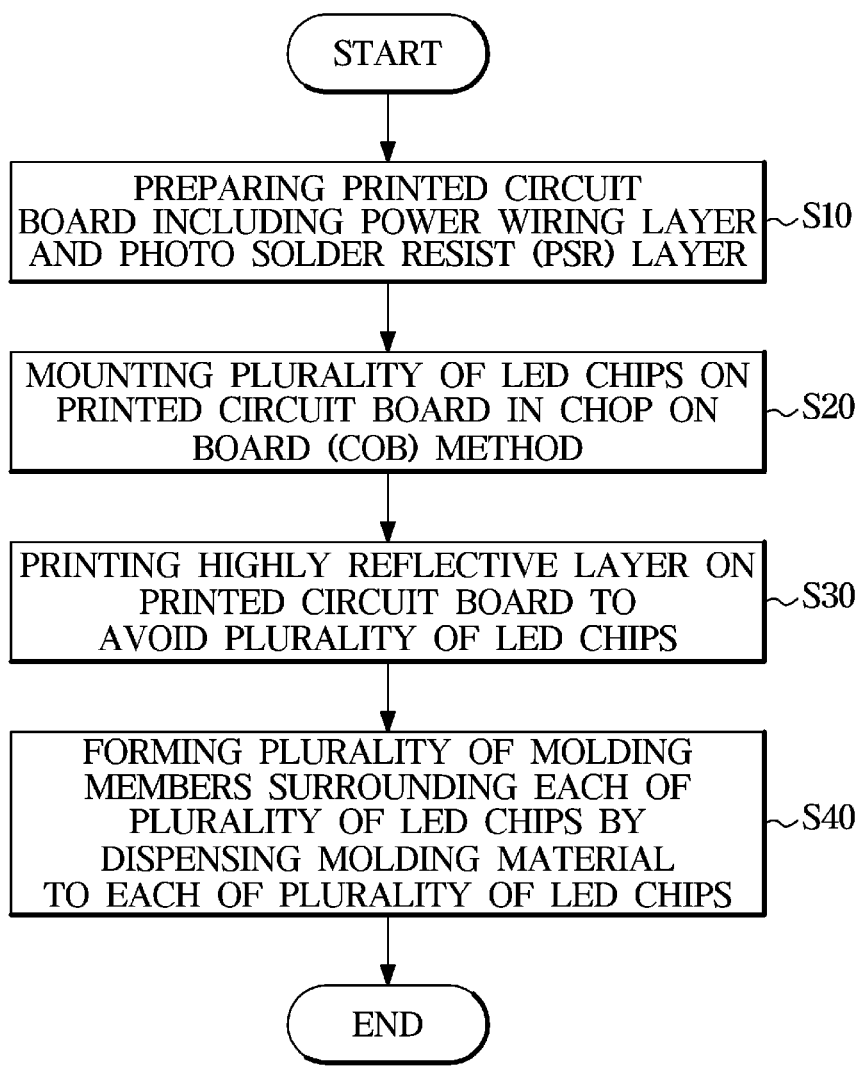
FIG. 11 is a flowchart illustrating a manufacturing method of the display apparatus according to another embodiment of the present disclosure.

FIG. 7 is an exploded view illustrating a display apparatus according to another embodiment of the disclosure. FIG. 8 is a view illustrating a light source plate of the display apparatus according to another embodiment of the disclosure. FIG. 9 is a view illustrating the light source plate of the display apparatus according to another embodiment of the disclosure, particularly, illustrating a state before dispensing a molding material on the LED chips. FIG. 10 is a cross-sectional view of the light source plate of the display apparatus according to another embodiment of the disclosure. FIG. 11 is a flowchart illustrating a method of manufacturing the display apparatus according to another embodiment of the disclosure.

A display apparatus and a method of manufacturing the same according to another embodiment of the disclosure will be described with reference to FIGS. 7 to 11. The same reference numerals may be assigned to the same components as in the above-described embodiment, and descriptions thereof may be omitted.

A display apparatus 201 may include a liquid crystal panel 10 displaying an image, a backlight unit disposed behind the liquid crystal panel 10 to provide light to the liquid crystal panel 10, and a chassis assembly supporting the backlight unit and the liquid crystal panel 10.

The backlight unit may be disposed at the rear of the liquid crystal panel 10 to provide light to the liquid crystal panel 10. The backlight unit may include a light source plate 280 including a printed circuit board 290 on which LED chips 300, which is light source, are mounted, and optical members disposed on a movement path of light emitted from the light source plate 280.

The light source plate 280 may have a flat plate shape. The light source plate 280 may be disposed in parallel with the liquid crystal panel 10.

The light source plate 280 may include a printed circuit board 290 and the plurality of LED chips 300 mounted on a surface of the printed circuit board 290 facing the liquid crystal panel 10. In addition, the light source plate 280 may include a highly reflective layer 330 and a plurality of molding members 320. The highly reflective layer 330 may be printed on the printed circuit board 290 to avoid the plurality of LED chips 300, and the plurality of molding members 320 may be formed to surround each of the plurality of LED chips 300 so as to protect the plurality of LED chips 300 and to increase light efficiency.

Unlike the above-described embodiment, the display apparatus 201 may not include a reflective sheet.

The highly reflective layer 330 may include a material having a high surface reflectivity. For example, the highly reflective layer 330 may include titanium dioxide (TiO2). The highly reflective layer 330 may include a plurality of openings 331 formed at a position corresponding to the plurality of LED chips 300.

An inner circumferential surface 332 of the plurality of openings 331 may be formed to be spaced apart from the corresponding LED chip 300. A molding material may be dot-dispensed into each of the plurality of openings 331, and the inner circumferential surface 332 of the plurality of openings 331 may serve to define the shape of the molding member 320.

The plurality of molding members 320 may be formed by dispensing the molding material to each of the plurality of LED chips 300 and then curing the molding material. The molding material may be silicone or epoxy resin.

When the molding material is dispensed to the LED chip 300, the molding material may spread to the inner circumferential surface 332 of the plurality of openings 331 by gravity. Accordingly, the molding member 320 may include a body 321 having a cylindrical shape and disposed inside the opening 331, and a light emitter 322 protruding from the body 321 toward the liquid crystal panel 10 and having a dome shape. A height HB of the body 321 may be equal to a thickness D of the highly reflective layer 330.

As a result, the shape of the molding member 320 may be determined by the shape and size of the opening 331 of the highly reflective layer 330 and the thickness D of the highly reflective layer 330. Accordingly, by uniformly forming the shape and size of the plurality of openings 331 and the thickness D of the highly reflective layer 330, the shape of the plurality of molding members 320 may be uniformly formed.

A method of manufacturing the display apparatus will be briefly described with reference to FIG. 11.

First, a printed circuit board including a power wiring layer and a photo solder resist (PSR) layer is prepared (10).

Next, a plurality of LED chips is mounted on the printed circuit board in a Chip On Board (COB) method (20).

Next, a highly reflective layer is printed on the printed circuit board to avoid the plurality of LED chips (30).

Next, a molding material is dispensed to each of the plurality of LED chips to form a plurality of molding members surrounding each of the plurality of LED chips (40).

While the present disclosure has been particularly described with reference to exemplary embodiments, it should be understood by those of skilled in the art that various changes in form and details may be made without departing from the spirit and scope of the present disclosure.

What is claimed is:
1. A display apparatus, comprising:
   a liquid crystal panel including a front surface on which an image is displayed;

a light source plate behind the liquid crystal panel to provide light to the liquid crystal panel, the light source plate including:
a printed circuit board including a power wiring layer, a Photo Solder Resist (PSR) layer, and substrate electrodes,
a plurality of light emitting diode (LED) chips directly mountable on the printed circuit board in a Chip On Board (COB) method,
a plurality of molding members respectively corresponding to the plurality of LED chips, wherein each molding member of the plurality of molding members has a dome shape, is formed of a thixotropic molding material, has a height greater than or equal to half a radius of an underside of the molding member, and surrounds the corresponding LED chip of the plurality of LED chips, and
a reflective sheet between the liquid crystal panel and the light source plate and including a plurality of openings respectively corresponding to the plurality of mounting members, each opening of the plurality of openings formed at a position corresponding to a position of the corresponding molding member of the plurality of molding members, each molding member of the plurality of molding members is positioned inside the corresponding opening of the plurality of openings with each molding member of the plurality of molding members spaced apart from an inner circumferential surface of the corresponding opening of the plurality of openings.

2. The display apparatus of claim 1, wherein
each LED chip of the plurality of LED chips is a flip chip type LED including a chip body having a top surface, a side surface, and a bottom surface; and chip electrodes formed on the bottom surface of the chip body.

3. The display apparatus of claim 2, wherein
each molding member of the plurality of molding members is formed to be in contact with at least the top surface and the side surface of the chip body.

4. The display apparatus of claim 2, wherein
the printed circuit board includes substrate electrodes corresponding to the chip electrodes,
wherein the chip electrodes and the substrate electrodes are electrically connected by solder bumps.

5. The display apparatus of claim 1, wherein
the thixotropic molding material comprises silicon dioxide (SiO2).

6. The display apparatus of claim 1, wherein
the thixotropic molding material is a silicone or epoxy resin.

7. A display apparatus comprising:
a liquid crystal panel comprising a front surface on which an image is displayed; and
a light source plate behind the liquid crystal panel to provide light to the liquid crystal panel,
wherein the light source plate includes:
a printed circuit board comprising a power wiring layer and a Photo Solder Resist (PSR) layer;
a plurality of light emitting diode (LED) chips directly mountable on the printed circuit board in a Chip On Board (COB) method;
a highly reflective layer to be printed on the printed circuit board to avoid contact with the plurality of LED chips, the highly reflective layer including a plurality of openings respectively formed at positions corresponding to each LED chip of the plurality of LED chips; and
a plurality of molding members formed of a molding material to respectively surround each LED chip of the plurality of LED chips so that the plurality of molding members contact inner circumferential surfaces of each opening of the plurality of openings,
wherein a height of each molding member of the plurality of molding members is greater than a depth of each corresponding opening of the plurality of openings.

8. The display apparatus of claim 7, wherein
each molding member of the plurality of molding members comprises a body positioned inside a corresponding opening of the plurality of openings and having a cylindrical shape; and a light emitter protruding from the body toward the liquid crystal panel and having a dome shape.

9. The display apparatus of claim 8, wherein
a height of the body corresponds to a thickness of the highly reflective layer.

10. The display apparatus of claim 7, wherein
the highly reflective layer includes titanium dioxide (TiO2), and the molding material is silicone or epoxy resin.

11. The display apparatus of claim 7, wherein
each LED clip of the plurality of LED chips is a flip chip type LED chip including a chip body comprising a top surface, a side surface, and a bottom surface; and chip electrodes formed on the bottom surface of the chip body.

12. The display apparatus of claim 11, wherein
each molding member of the plurality of molding members is formed to be in contact with at least the top surface and the side surface of the chip body.

13. The display apparatus of claim 11, wherein
the printed circuit board comprises substrate electrodes corresponding to the chip electrodes,
wherein the chip electrodes and the substrate electrodes are electrically connected by solder bumps.

* * * * *